United States Patent [19]
Idaka et al.

[11] Patent Number: 5,473,197
[45] Date of Patent: Dec. 5, 1995

[54] SEMICONDUCTOR DEVICE HAVING BUMP ELECTRODES WITH A TRAPEZOIDAL CROSS-SECTION ALONG ONE AXIS

[75] Inventors: Toshiaki Idaka, Yokohama; Hirokazu Ezawa, Tokyo, both of Japan

[73] Assignee: Kabushiki Kaisha Toshiba, Kawasaki, Japan

[21] Appl. No.: 246,744

[22] Filed: May 20, 1994

[30] Foreign Application Priority Data

May 28, 1993 [JP] Japan .................................. 5-126582

[51] Int. Cl.⁶ .................. H01L 21/321; H01L 21/04
[52] U.S. Cl. .................. 257/786; 257/737; 257/780; 257/751
[58] Field of Search .................... 257/786, 751, 257/778, 737–738, 211, 249, 780–781

[56] References Cited

U.S. PATENT DOCUMENTS 5,049,972  9/1991  Uda et al. .................................. 257/211
5,061,985  10/1991  Meguro et al. .......................... 257/751

FOREIGN PATENT DOCUMENTS

2-28933   1/1990  Japan .
2-119228  5/1990  Japan .

Primary Examiner—Robert P. Limanek
Assistant Examiner—Alexander Oscar Williams
Attorney, Agent, or Firm—Finnegan, Henderson, Farabow, Garrett & Dunner

[57] ABSTRACT

Pads are formed on a semiconductor substrate and the pads are covered with a passivation film. Openings are formed in the passivation film and the pads are exposed via the openings. A barrier metal layer is formed on the bottom surface and side surface of each of the openings and the upper surface of the passivation film lying on the periphery of each of the openings. Bump electrodes are filled in the openings and project upwardly from the openings. The area of the upper surface of the bump electrode is larger than the area of the bottom surface thereof connected to the pad. The cross section of the bump electrode in a direction along the periphery of the semiconductor substrate takes a rectangular form and the cross section of the bump electrode in a direction perpendicular to the periphery of the semiconductor substrate takes a trapezium form having an upper side longer than a bottom side thereof.

5 Claims, 7 Drawing Sheets

SEMICONDUCTOR DEVICE HAVING BUMP ELECTRODES WITH A TRAPEZOIDAL CROSS-SECTION ALONG ONE AXIS

BACKGROUND OF THE INVENTION

1. Field of the Invention

This invention relates to a semiconductor device, and more particularly to bump electrodes formed on the semiconductor device and a method for manufacturing the semiconductor device.

2. Description of the Related Art

Recently, the thickness of a large-scale semiconductor integrated circuit (LSI) has been reduced and a large number of electrodes are disposed with the pitch between electrodes reduced. This type of LSI is widely used in a logic circuit having a large number of signal terminals.

Further, as the mounting technique is further enhanced, the technique called the tape automated bonding (TAB) technique is more widely used. The TAB technique is used to previously form bump electrodes which project high in the signal derive-out portion of the LSI chip and previously prepare a film carrier. The film carrier is formed by forming a lead pattern of copper or the like on a film having a high insulating property and high heat resistance. When the LSI chip is bonded to the lead pattern of the film carrier, the inner leads of the lead pattern formed on the film carrier are first aligned with the bump electrodes, and then, the front end portions of the inner leads are pressed against the bump electrodes and they are heated so as to be bonded together.

Figure 10:
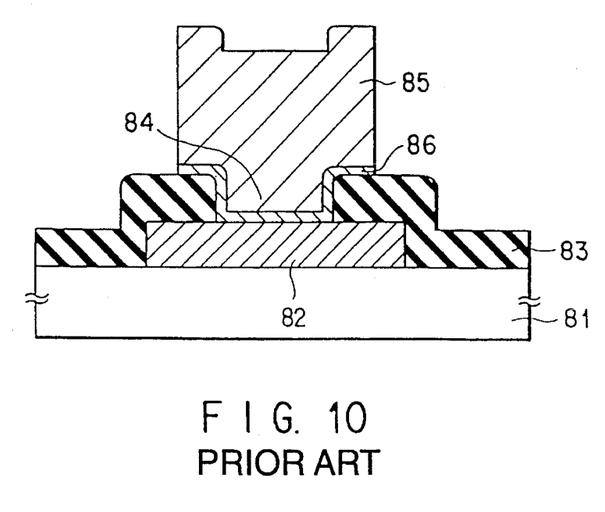
FIG. 10 is a cross sectional view showing one example of the conventional bump electrode.

FIG. 10 shows an example of the structure of the conventional bump electrode.

A pad 82 is formed of aluminum on a semiconductor substrate 81. A passivation film 83 is formed on the pad 82 and substrate 81 and an opening 84 is formed in the passivation film 83 to expose part of the surface of the pad 82. A barrier metal layer 86 is formed on the bottom and side surfaces of the opening 84 and that portion of the passivation film 83 which lies on the peripheral portion of the opening 84 and a bump electrode 85 is formed on the barrier metal layer 86. Generally, gold (Au) is used to form the bump electrode 85 and the barrier metal layer 86 prevents formation of a weak chemical composite by forming the gold layer in direct contact with the pad 82. The bump electrode 85 is electrically connected to the pad 82 via the barrier metal layer 86.

with formation of LSIs of greater miniaturization, it becomes necessary to reduce the pitch between the pads and reduce the pad size. Therefore, the size of the bump electrode 85 becomes small so that the area of that portion of the bump electrode 85 which is set in contact with the inner lead will be decreased, thereby making it difficult to sufficiently enhance the strength of bonding therebetween. In addition, when the LSI chip is bonded to the inner lead of the film carrier, the front end portion of the inner lead tends to be deviated from the bump electrode 85 and the contact area therebetween is further decreased, thereby causing a serious problem that the bonding strength thereof will be further lowered.

As one example of a method for solving the above problem. It is considered to form the bump electrode with the area of the upper portion thereof made larger than that of the bottom portion thereof so as to increase the contact area with the inner lead.

Figure 11A:
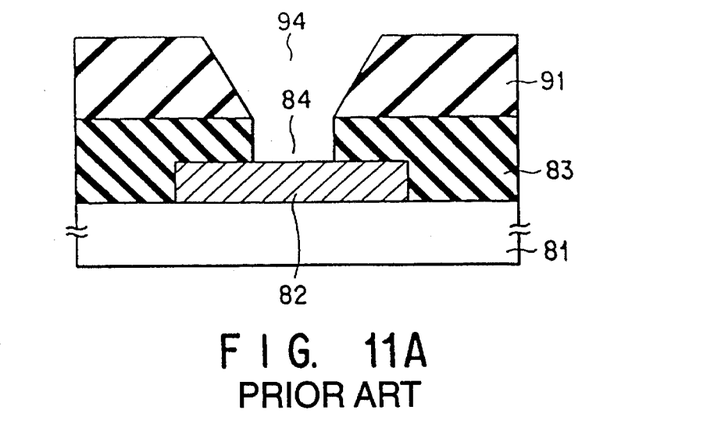
FIGS. 11A and 11B are cross sectional views for schematically illustrating the process of manufacturing another example of the conventional bump electrode.
Figure 11B:
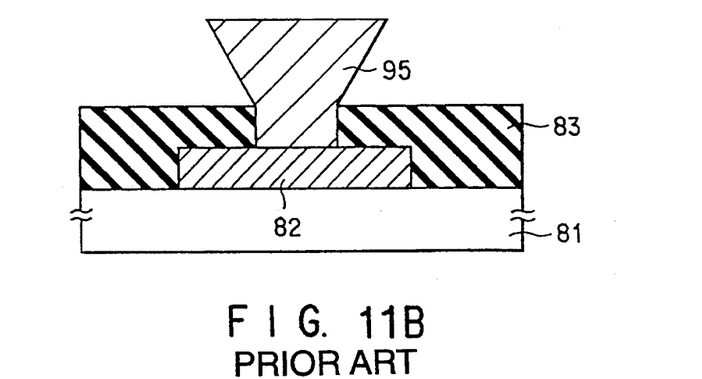

That is, as shown in FIGS. 11A, 11B, the pad 82 and passivation film 83 are formed on the substrate 81 and a photoresist film 91 is formed to cover them. Then, an opening 94 is formed in the bump electrode forming position by subjecting the photoresist film 91 to the exposure, development and baking. In this case, the cross section of the opening 94 is made such that the area of the upper portion thereof will be larger than that of the bottom portion thereof by controlling the condition of the exposure, development and baking. Next, gold is plated on the inner wall of the opening 94 with the photoresist film 91 used as a mask so as to form a bump electrode 95. After this, as shown in FIG. 11B, the photoresist film 91 is removed.

In the bump electrode 95 of the above structure, the area of the upper portion thereof can be made larger than that of the bottom portion. However, in the above manufacturing method, since the upper portion of the bump electrode 95 spreads in all directions, the distance between the adjacent bump electrodes is reduced. Therefore, if the specification of the pad interval is set to be small, there occurs a possibility that the adjacent bump electrodes may be set in contact with each other.

Figure 12:
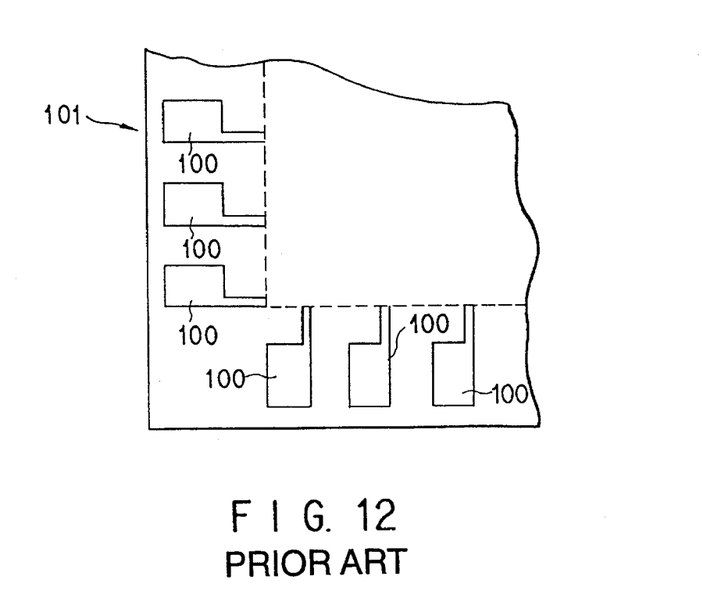
FIG. 12 is a plan view showing the main portion of still another example of the conventional bump electrode.

FIG. 12 shows another example of a method for solving the above problem. In this case, the plane pattern of the bump electrodes 100 is made such that the length of the bump electrode in the arrangement direction of the bump electrodes will be made smaller than that in the direction perpendicular to the arrangement direction. Therefore, a sufficiently large distance can be set between the adjacent bump electrodes 100 and it becomes possible to prevent the bump electrodes 100 from being set in contact with each other. However, in order to form the bump electrode 100 of the above structure, it is also necessary to form the pads such that the length of the pad in the arrangement direction will be made smaller than that in the direction perpendicular to the arrangement direction. Therefore, the area of an LSI chip 101 in which the pads and bump electrodes are arranged becomes larger and the whole size of the LSI chip is increased. The structure in which the length of the bump electrode in the arrangement direction of the bump electrodes is made smaller than that in the direction perpendicular to the arrangement direction is disclosed in Jpn. Pat. Appln. KOKAI Publication No. 2-28933 and No. 2-119228.

SUMMARY OF THE INVENTION

An object of this invention is to provide a semiconductor device and a method for manufacturing the same in which even if the pad interval on the semiconductor chip is reduced, the area of the upper portion of a bump electrode on a pad can be made large, the strength of bonding between the bump electrode and the lead member can be made sufficiently large, an increase in the area in which the bump electrodes are arranged on the semiconductor chip can be prevented, and an increase in the whole size of the semiconductor chip can be suppressed.

The above object can be attained by a semiconductor device comprising a plurality of pad areas formed on a semiconductor substrate, the semiconductor substrate having an element region in which a circuit pattern is formed and the pad areas being arranged along the periphery of the element region and connected to the element region; and a plurality of bump electrodes connected to the pad areas, each of the bump electrodes having a square bottom surface and a rectangular upper surface, a shorter one of the sides of the upper surface having substantially the same length as one side of the square and the cross section of each of the bump electrodes in a direction perpendicular to the periphery of the element region having a trapezoidal shape.

The above object can be attained by a method for manufacturing a semiconductor device comprising the steps of forming a plurality of pad areas on a semiconductor substrate, forming a passivation film on the pad areas, and forming first openings in the passivation film in positions corresponding to the pad areas; covering the entire surface of the passivation film with an organic film; forming second openings in the organic film in positions corresponding to the first openings and in communication with the respective first openings and forming groove portions in the surface of the organic film at least in positions between the second openings; effecting the heat treatment to contract the organic film and enlarge the upper end portion of the second opening in a direction towards a portion in which the groove portion is not formed; forming bump electrodes of metal connected to the pad areas in the first and second openings; and removing the organic film.

Further, the above object can be attained by a method for manufacturing semiconductor device, comprising the steps of: forming an organic film on a substrate; forming a plurality of openings in the organic film and grooves in at least those portions of the organic films which are located among the openings; applying heat to the organic film, thereby causing the organic film to shrink and the openings to expand at top away from the grooves; forming bump electrodes made of metal, in the opening, respectively; adhering a sheet member to tops of the bump electrodes and pulling the sheet member upward, thereby removing the bump electrodes from the openings; and inserting lower portions of the bump electrodes into openings made in a semiconductor substrate, setting each bump electrode in contact with a pad formed in the opening of the semiconductor substrate.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

There will now be described an embodiment of this invention with reference to the accompanying drawings.

Figure 1:
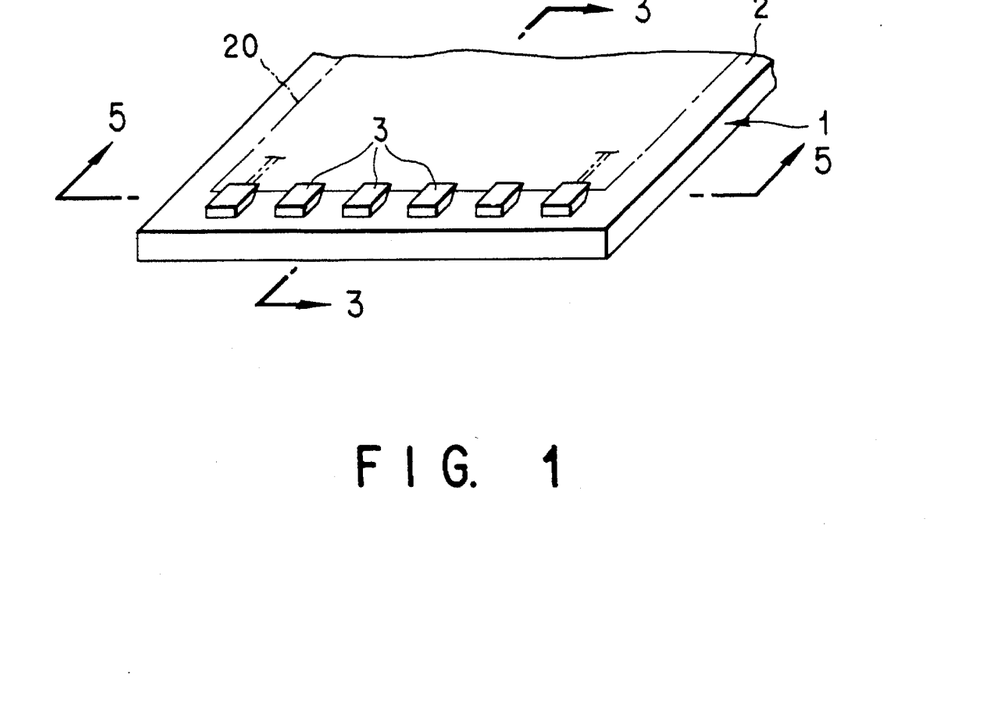
FIG. 1 is a perspective view showing a first embodiment of this invention with partly cut-away portion.

FIG. 1 shows bump electrodes according to a first embodiment of this invention.

Figure 2:
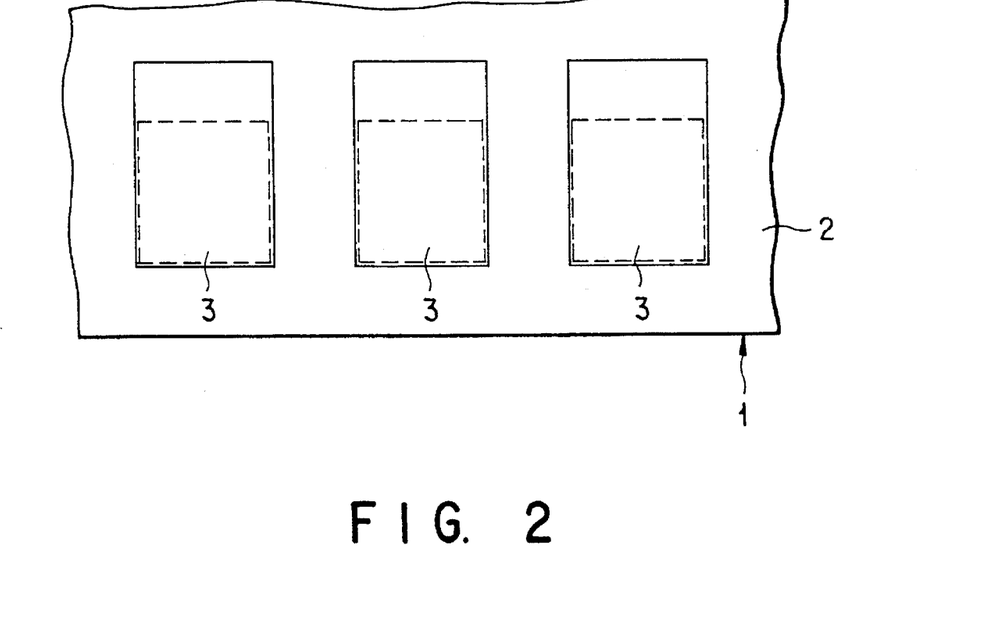
FIG. 2 is a top plan view of bump electrodes shown in FIG. 1.

In FIG. 1, a passivation film 2 is formed on the surface of an LSI chip 1. A plurality of bump electrodes 3 are arranged in the peripheral region of the LSI chip 1, that is, in a direction along the periphery of an element region 20 in which a circuit pattern of the LSI chip 1 such as semiconductor elements and wirings is formed and are exposed and are not covered with the passivation film 2. As shown by solid lines in FIG. 2, the pattern of the upper surface of each of the bump electrodes 3 is made in the rectangular form and the pattern of the bottom surface thereof is made in the square form as shown by broken lines, for example, and the area of the upper surface is made larger than that of the bottom surface. That is, in the pattern of the upper surface, the length of one side perpendicular to the arrangement direction of the bump electrodes 3 is made larger than that of the side in the arrangement direction. In the pattern of the bottom surface, the length of each side is made equal to that of the side of the upper surface in the arrangement direction. The pattern of the upper surface extends more inwardly of the LSI chip, that is, towards the element region 20, than the pattern of the bottom surface.

Figure 3A:
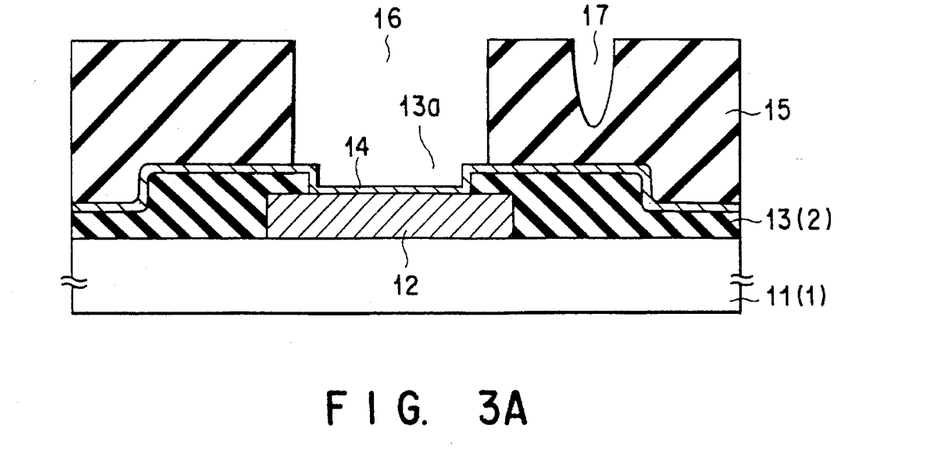
FIGS. 3A, 3B, 3C are cross sectional views taken along the lines 3—3 of FIG. 1, for illustrating the process of manufacturing the bump electrode shown in FIG. 1.
Figure 3B:
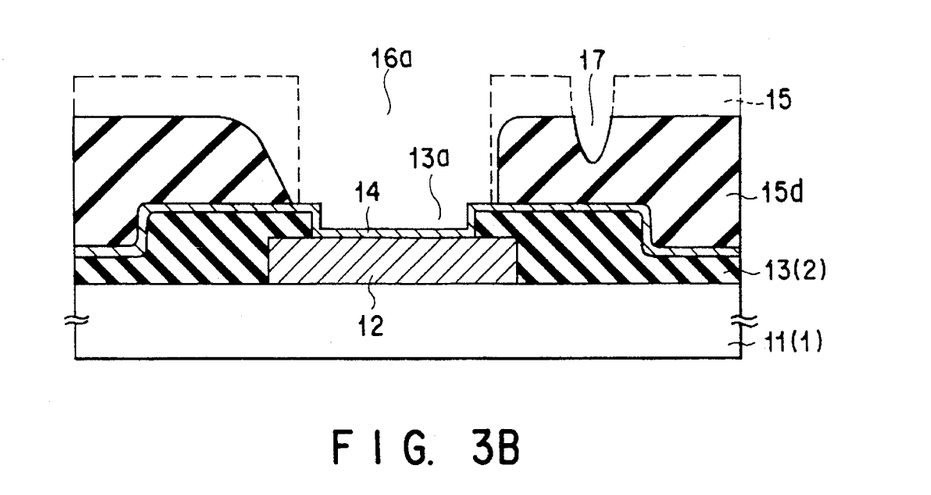
Figure 3C:
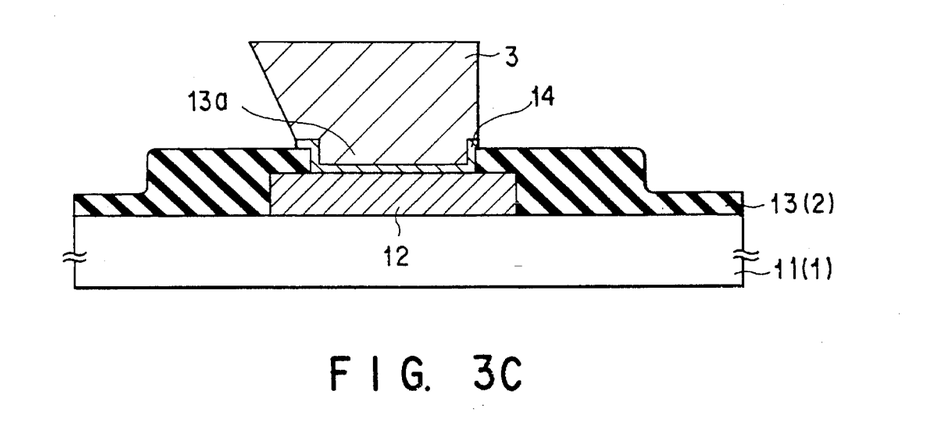

FIGS. 3A, 3B, 3C schematically illustrate the process of manufacturing the bump electrodes 3 shown in FIG. 1.

As shown in FIG. 3A, a pad 12 of aluminum connected to the element region 20 is first formed on the semiconductor substrate 11, and then a passivation film 13 is formed on the entire surface of the substrate 11. An opening 13a is formed in a portion of the passivation film 13 in which the bump electrode is to be formed and a barrier metal layer 14 is formed on the bottom and side surfaces of the opening 13a and that portion of the passivation film 13 which lies on the peripheral portion of the opening 13a. After this, an organic film, for example, photoresist film 15 is formed to cover the entire upper surface of the substrate 11. Then, an opening 16 is formed in the bump electrode forming position by subjecting the photoresist film 15 to the exposure, development and baking. At the same time, a groove portion 17 is formed in that portion of the surface of the photoresist film 15 which lies near the opening 16. The depth of the groove portion 17 is approximately one half the thickness of the photoresist film 15.

Figure 4:
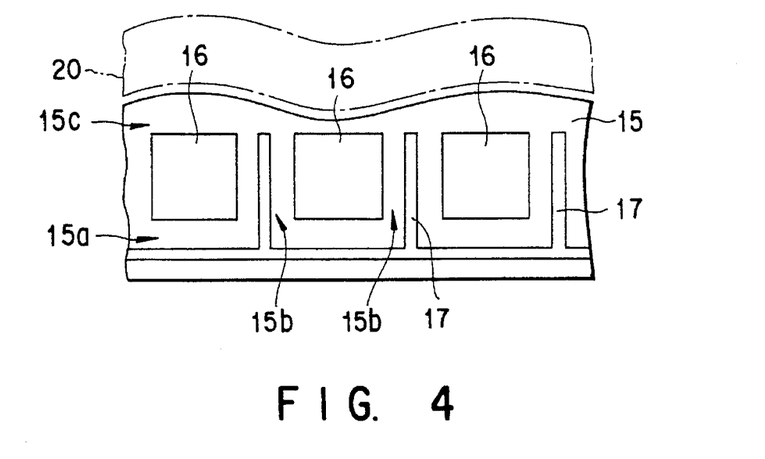
FIG. 4 is a plan view showing a photoresist film shown in FIG. 3A.

As shown in FIG. 4, for example, the groove portion 17 is formed in each of the surface area 15a of the photoresist film 15 which lies along the periphery of the LSI chip 1 and the surface area 15b of the photoresist film 15 which lies between the openings 16. The groove portion 17 is not formed in the surface area 15c of the photoresist film 15 which lies between the openings 16 and the element region 20. That is, the groove portion 17 is formed along three sides among the four sides of the opening 16 except one side which lies on the element region 20 side. As the method for forming the groove portion 17, a method for forming a narrow pattern in a photo mask, for example, is used. A narrow and shallow groove as shown in FIG. 3A can be formed by setting the pattern smaller than the lower limit of the resolution of the photoresist and pattern exposure system.

After this, the heat treatment is effected for approx. 10 minutes at temperatures of approx. 130° C. so as to contract the photoresist film 15. Then, as shown in FIG. 3B, a large area portion of the photoresist film 15 which lies nearer to the center of the chip than the opening 16 is significantly contracted more than a small area portion of the photoresist film 15 which lies between the opening 16 and the groove portion 17. That is, when the groove portion 17 is formed in the surface of the photoresist film 15, the contraction of the photoresist film is interrupted by the groove portion 17. As described before, the groove portion 17 is formed along the three sides among the four sides of the opening 16 except one side lying on the element region side. Therefore, the opening 16a formed in the photoresist film 15d obtained after the heat treatment has an upper end portion formed to significantly extend only towards the element region.

Next, as shown in FIG. 3C, a bump electrode 3 of gold is formed in the openings 16a and 13a by using the photoresist film 15d obtained after the heat treatment as a mask. The bump electrode 3 is formed by the electroless plating or the electrolytic plating using the barrier metal layer 14 as the electrode, for example. After this, the photoresist film 15d is removed.

Figure 5:
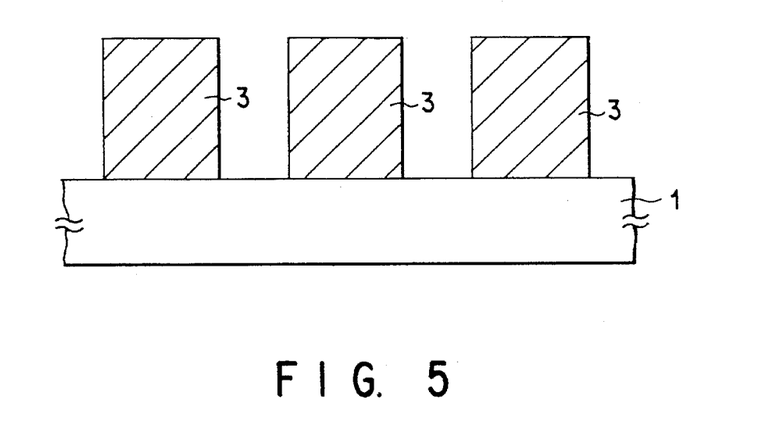
FIG. 5 is a cross sectional view taken along the line 5—5 of FIG. 1 and showing the bump electrodes.
Figure 6:
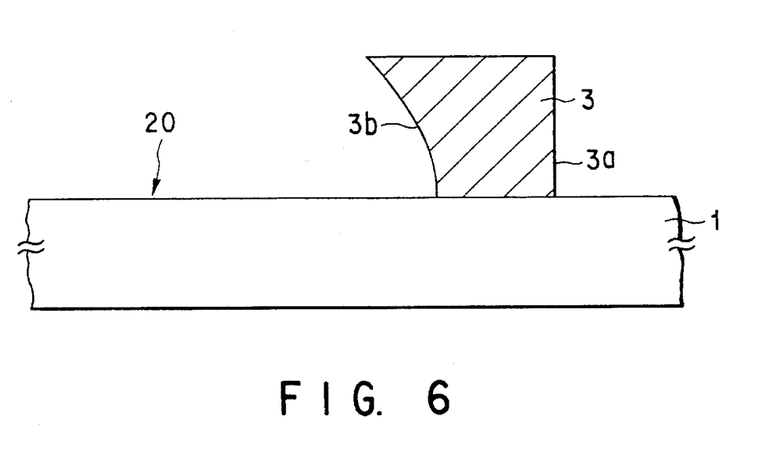
FIG. 6 is a cross sectional view taken along the line 3—3 of FIG. 1 and showing the bump electrodes.

The bump electrode 3 formed as described above has a substantially rectangular cross section in a direction along the periphery of the LSI chip 1 as shown in FIG. 5 and has a trapezoidal cross section having an upper side longer than a bottom side in a direction perpendicular to the periphery of the LSI chip 1 as shown in FIG. 6. In the bump electrode 3, the side surface 3a lying on the peripheral side of the LSI chip 1 is substantially normal to the bottom side and the side surface 3b lying on the inner side of the LSI chip 1 extends towards the element region 20. The side surface 3b may be formed to extend over the element region 20.

Figure 7:
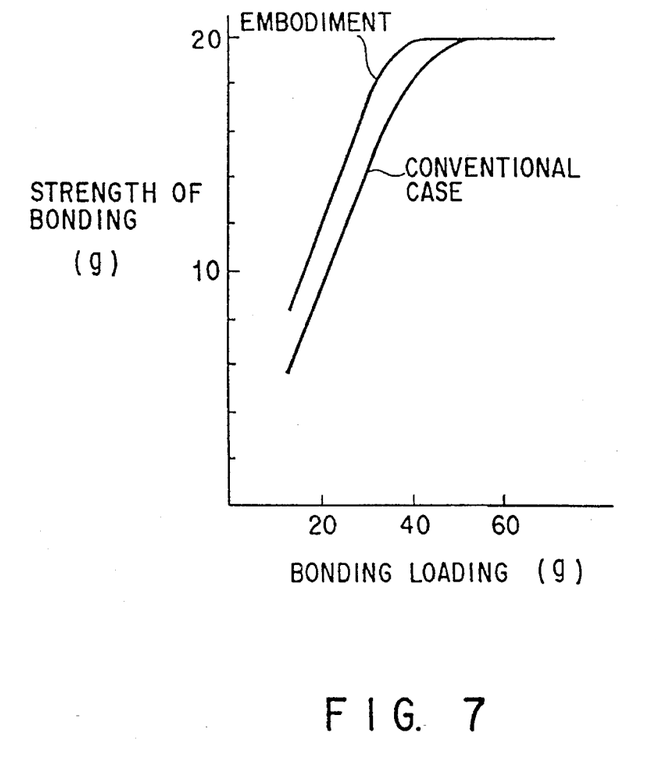
FIG. 7 is a characteristic diagram showing the strength of bonding between the bump electrode of this invention and an inner lead and the strength of bonding between the conventional bump electrode and an inner lead.

FIG. 7 shows the strength of bonding between the bump electrode 3 of this embodiment and an inner lead and the strength of bonding between the conventional bump electrode and an inner lead. In the case of this embodiment, in the trapezoidal cross section of the bump electrode, the upper side is made longer towards the element region than the bottom side by approx. 25%. Further, the conventional bump electrode is formed to have upper and bottom surfaces which have the same area as the bottom surface of the bump electrode 3 of this embodiment. The bump electrodes were bonded to the same inner leads and the strength of bonding between each bump electrode and the inner lead was measured.

As is clearly understood from FIG. 7, the strength of bonding between the bump electrode and the inner lead of this embodiment is larger than the strength of bonding between the conventional bump electrode and the inner lead. Further, it was confirmed that the strength of bonding between the bump electrode and the inner lead member could be increased to a practically sufficiently large value if the upper side of the trapezoidal cross section of the bump electrode 3 was formed to be longer than the bottom side by 20% or more.

In the above embodiment, only that portion of the upper surface of the bump electrode 3 which lies on the element region 20 side of the LSI chip 1 is formed to extend. Therefore, even if the size of each of the pads on the LSI chip is reduced, the area of the upper surface of the bump electrode which is set in contact with the inner lead can be made sufficiently large so that the strength of bonding between the bump electrode and the inner lead member can be made sufficiently large. Further, the upper surface of the bump electrode 3 extends only in the direction towards the element region 20 and does not extend in the arrangement direction of the bump electrodes 3. Therefore, even if the distance between pads is reduced, the distance between the bump electrodes 3 can be kept sufficiently long. As a result, it is not necessary to increase the size of the area in which the bump electrodes 3 are arranged, making it possible to suppress an increase in the size of the whole chip.

Figures 8A, 8B:
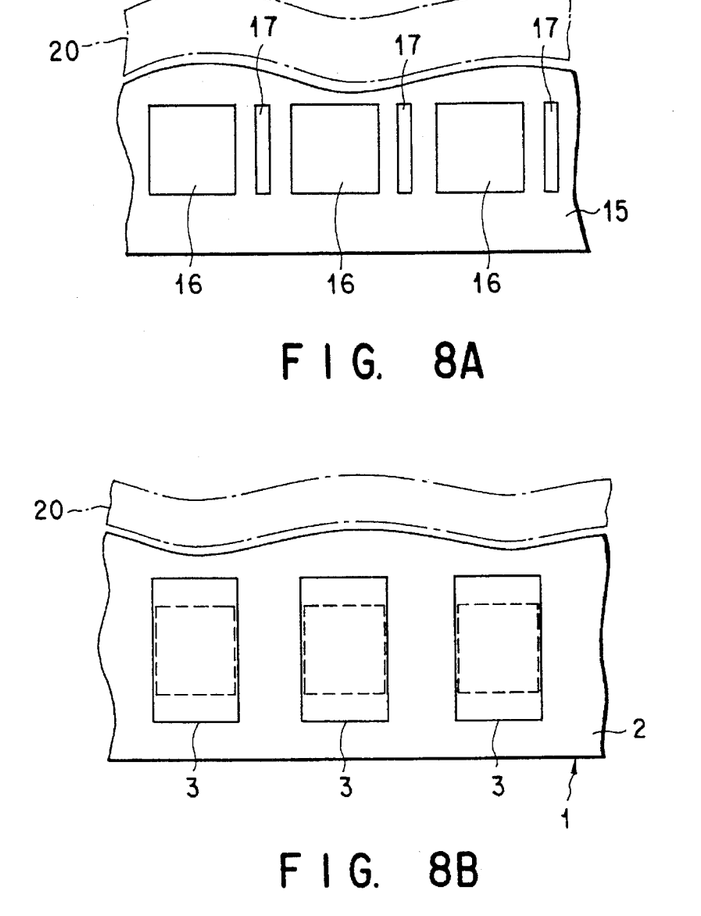
FIG. 8A is a plan view showing a photoresist film, for illustrating a second embodiment of this invention.
FIG. 8B is a plan view showing bump electrodes, for illustrating the second embodiment of this invention.
Figure 8C:
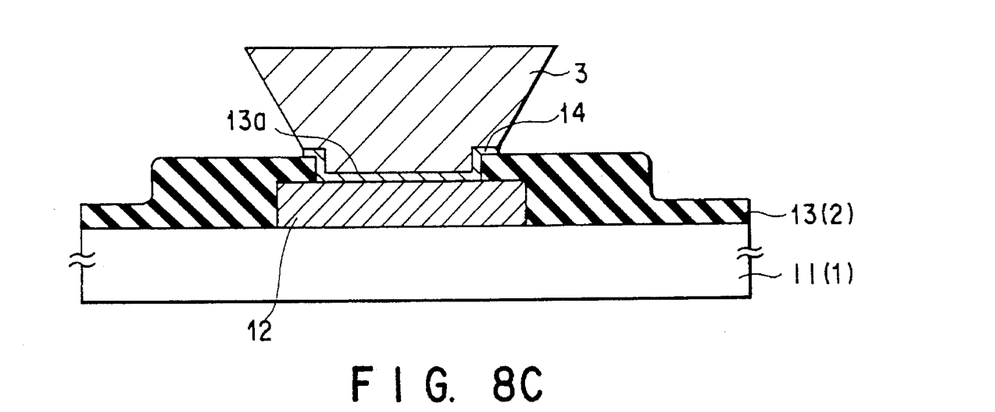
FIG. 8C is a cross sectional view showing the bump electroded, for illustrating the second embodiment of this invention.

Next, a second embodiment of this invention is explained with reference to FIGS. 8A, 8B, 8C. In FIGS. 8A, 8B, 8C, portions which are the same as those of FIGS. 1 to 4 are denoted by the same reference numerals. In this embodiment, the area of the upper surface of the bump electrode is further increased in comparison with a case of the first embodiment. The manufacturing method of this embodiment is almost the same as that of the first embodiment and only a groove portion 17 formed in the photoresist film 15 is different.

That is, as shown in FIG. 8A, groove portions 17 are formed in the photoresist film 15 only in positions between openings 16. When the photoresist film 15 is subjected to the heat treatment after the groove portions 17 are thus formed, the upper end portions of the openings 16 are significantly contracted in both of the directions towards the element regions 20 of the LSI chip 1 and towards the periphery thereof. Therefore, if the photoresist film 15 is removed after the inner wall of the opening 16 is plated with gold, bump electrodes 3 shown in FIGS. 8B, 8C can be formed. That is, the upper surface of the bump electrode 3 extends in two directions towards the element region 20 of the LSI chip 1 and the periphery of the LSI chip 1.

According to this embodiment, the bump electrode 3 in which the area of the bottom surface is the same as that of the first embodiment and the area of the bottom surface is larger than that of the first embodiment can be formed. Further, the upper surface of the bump electrode 3 does not extend in the arrangement direction of the bump electrodes 3. For this reason, even if the distance between the pads is reduced, the distance between the bump electrodes 3 can be made sufficiently long.

Next, a third embodiment of this invention is explained with reference to FIGS. 9A, 9B, 9C, 9D. In this embodiment, bump electrodes are formed by a transferring bump system. In FIGS. 9A, 9B, 9C, 9D, portions which are the same as those of FIGS. 1 to 4 are denoted by the same reference numerals.

Figure 9A:
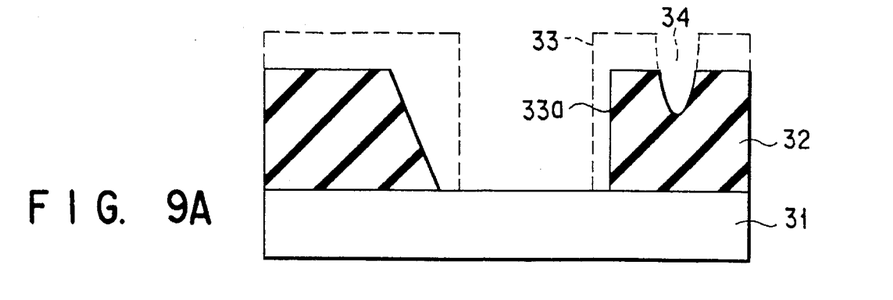
FIGS. 9A, 9B, 9C, 9D are cross sectional views sequentially showing the steps of manufacturing the bump electrode according to a third embodiment of this invention.

First, as indicated by broken lines in FIG. 9A, a photoresist 32 having an opening 33 and a groove 34 is formed by the method explained with reference to FIGS. 3A and 3B, on the upper surface of the structure which is comprised of a glass substrate 31 and an ITO film (not shown) made of indium, tin and oxide formed on the substrate 31. Like the groove 17 described above, the groove 34 is formed along these sides among the four sides of the opening 34. FIGS. 9A to 9D show only one groove 34. Then, heat is applied to the photoresist 32. As a result, the photoresist 32 shrinks to the size indicated by solid lines in FIG. 9A, and the opening 33 is broadened, forming an opening 33a which has a trapezoidal cross section.

Figure 9B:
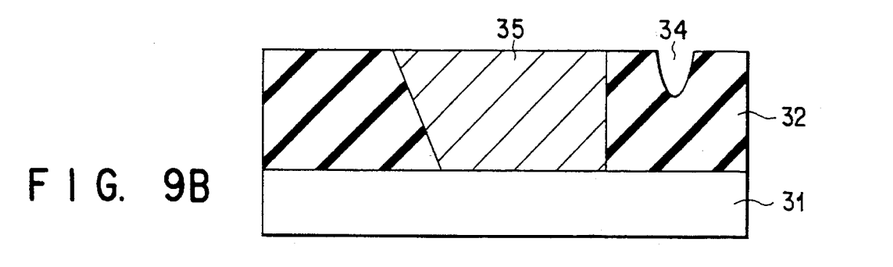

Thereafter, as shown in FIG. 9B, the opening 33a is filled with gold by means of plating, thereby forming a bump electrode 35. The top of the bump electrode 35 has the same shape as the bump electrode 3 shown in FIG. 2.

Figure 9C:
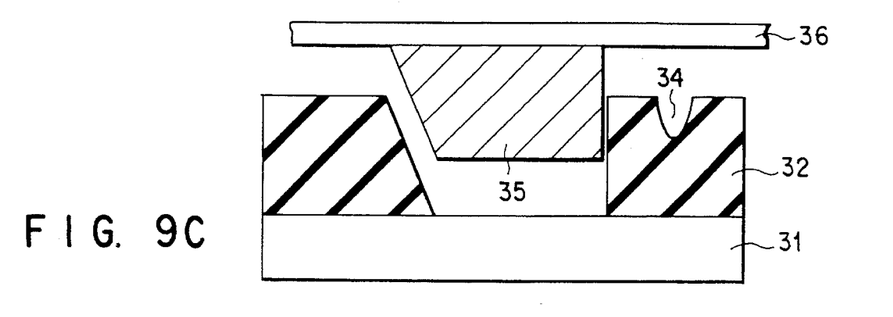

Then, as shown in FIG. 9C, a lead tape 36 is adhered to the top of the bump electrode 35. The tape 36 is pulled upward, thereby removing the bump electrode 35 from the opening 33a.

Figure 9D:
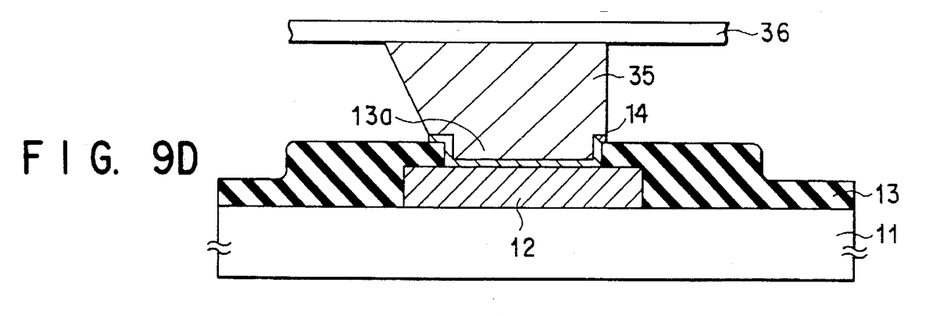

Next, as shown in FIG. 9D, the bump electrode 35 is inserted into the opening 13a for the pad 12 of the LSI chip 11 separately formed and the bump electrode 35 and pad 12 are connected together. The LSI chip 11 is formed in the same manner as in the process of the first and second embodiments.

Also, in this embodiment, the same effect as that of the first embodiment can be attained. Further, if the bump electrode 35 formed on the lead tape 36 is the same as that of the second embodiment, the same effect as that of the second embodiment can be attained.

In each of the above embodiments, a case wherein all of the bump electrodes are formed to have the same structure was explained, but it is possible to form only some of the bump electrodes to have the above structure.

Further, as the mask for plating, it is not limited to the photoresist and another material having thermal contraction characteristic, for example, a dry film can be used.

In addition, the bump electrode is formed by gold-plating, but it can be formed by copper-plating or sputtering or vapor deposition of metal.

What is claimed is:

1. A semiconductor device comprising:
    a plurality of pad areas formed on a semiconductor substrate, said semiconductor substrate having an element region in which a circuit pattern is formed and said pad areas being arranged along the periphery of said element region and connected to said element region; and
    a plurality of bump electrodes connected to said pad areas, each of said bump electrodes having a square bottom surface and a rectangular upper surface larger than the bottom surface, a shorter one of the sides of the upper surface having substantially the same length as one side of the square bottom surface and the cross section of each of said bump electrodes in a direction perpendicular to the periphery of said element region having a substantially trapezoidal shape.

2. A device according to claim 1, wherein the upper surface of each of said bump electrodes extends toward said element region only.

3. A device according to claim 1, wherein the upper surface of each of said bump electrodes extends toward said element region and towards the opposite side of said element region.

4. A semiconductor device comprising:
    a plurality of pad areas formed on a semiconductor substrate, said semiconductor substrate having an element region in which a circuit pattern is formed and said pad areas being arranged along the periphery of said element region and connected to said element region; and
    a plurality of bump electrodes connected to said pad areas, each of said bump electrodes having a square bottom surface and a rectangular upper surface, a shorter one of the sides of the upper surface having substantially the same length as one side of the square bottom surface and the cross section of each of said bump electrodes in a direction perpendicular to the periphery of said element region having a substantially trapezoidal shape;
    wherein the upper surface of each of said bump electrodes extends toward said element region only.

5. A semiconductor device comprising:
    a plurality of pad areas formed on a semiconductor substrate, said semiconductor substrate having an element region in which a circuit pattern is formed and said pad areas being arranged along the periphery of said element region and connected to said element region; and
    a plurality of bump electrodes connected to said pad areas, each of said bump electrodes having a square bottom surface and a rectangular upper surface larger than the bottom surface, a shorter one of the sides of the upper surface having substantially the same length as one side of the square bottom surface and the cross section of each of said bump electrodes in a direction perpendicular to the periphery of said element region having a substantially trapezoidal shape;
    wherein the upper surface of each of said bump electrodes extends toward said element region and towards the opposite side of said element region.

* * * * *